(12) United States Patent
Kurokawa

(10) Patent No.: US 7,385,444 B2
(45) Date of Patent: Jun. 10, 2008

(54) CLASS D AMPLIFIER

(75) Inventor: Tatsufumi Kurokawa, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 115 days.

(21) Appl. No.: 11/119,914

(22) Filed: May 3, 2005

(65) Prior Publication Data

US 2005/0270093 A1   Dec. 8, 2005

(30) Foreign Application Priority Data

Jun. 5, 2004   (JP) .............................. 2004-137108

(51) Int. Cl.
    *H03F 3/38* (2006.01)
(52) U.S. Cl. .................. 330/10; 330/207 A; 330/251
(58) Field of Classification Search .................. 330/10, 330/207 A, 251
    See application file for complete search history.

(56) References Cited

U.S. PATENT DOCUMENTS

| 4,134,076 | A |   | 1/1979  | Suzuki et al. |
| 4,504,793 | A |   | 3/1985  | Yokoyama |
| 4,949,048 | A |   | 8/1990  | Tokumo et al. |
| 4,968,948 | A | * | 11/1990 | Tokumo et al. ............... 330/10 |
| 5,479,337 | A | * | 12/1995 | Voigt .......................... 363/131 |
| 6,448,851 | B1 |   | 9/2002 | McIntosh et al. |
| 6,614,297 | B2 | * | 9/2003 | Score et al. .................. 330/10 |
| 6,847,257 | B2 | * | 1/2005 | Edwards et al. ............... 330/10 |
| 6,998,910 | B2 | * | 2/2006 | Hezar et al. .................. 330/10 |
| 7,076,070 | B2 | * | 7/2006 | Pearce et al. ................ 381/120 |
| 7,167,046 | B2 | * | 1/2007 | Maejima .................. 330/207 A |
| 2003/0006837 | A1 |   | 1/2003 | Score et al. |
| 2005/0156665 | A1 | * | 7/2005 | Maejima ..................... 330/251 |

FOREIGN PATENT DOCUMENTS

| EP | 1 178 388 A1 | 2/2002 |
| JP | 2003-115730  | 4/2003 |

OTHER PUBLICATIONS

European Search Report dated Aug. 1, 2005.
Korean Office Action dated Jul. 24, 2006, with partial English transation.

* cited by examiner

*Primary Examiner*—Robert J. Pascal
*Assistant Examiner*—Hieu Nguyen
(74) *Attorney, Agent, or Firm*—McGinn IP Law Group, PLLC

(57) ABSTRACT

The class D amplifier comprises a voltage control current source circuit for current-converting the voice voltage signal Vsin of the input into two signals with different polarities, two capacitance elements for integration where the electric charges of the each current-converted signal and the feedback signal are stored respectively, two hysteresis comparators for PWM conversion for comparing the potentials of the two capacitance elements for integration and a reference potential Vcom respectively, two output buffers for amplifying the outputs thereof respectively, and two constant current source feedback circuits for feeding back the output thereof respectively.

21 Claims, 9 Drawing Sheets

CLASS D AMPLIFIER

BACKGROUND OF THE INVENTION

1. Field of the Invention

The present invention relates to a class D amplifier to be installed in a portable telephone, for example, and more particularly to a class D amplifier of which the power consumption is decreased.

2. Description of the Related Art

Generally a digital amplifier comprises a comparator receiving an audio signal and a triangular wave carrier wave, putting out a PWM (Pulse Width Modulation) signal, and a class D output stage which amplifies the output of the comparator.

In such a digital amplifier, the comparator compares the audio signal and the triangular wave, and generates the PWM signal. The output stage switch is controlled by this PWM signal, and the load unit, such as a speaker, is driven by the output of the class D output stage. The high frequency component is removed by the output LPF (Low Pass Filter) during driving the load unit.

Practically, however, in a digital amplifier, non-linear distortion is generated due to the curvature of a triangular wave, pulse width distortion and power supply voltage variations, so negative feedback is used to improve non-linear distortion. One of such methods negatively feeds back the output of the output stage to the integrating amplifier installed as an integrating circuit in a previous stage of the comparator. The integrating amplifier extracts and amplifies the low frequency component included in the feedback signal of the square wave (PWM wave).

While this separately-excited oscillation type PWM system operates with such incoming triangular waves, there is a self-excited oscillation type PWM digital amplifier which oscillates by itself without incoming external triangular waves so that the output of the integrating amplifier is a triangular wave (e.g. Japanese Unexamined Patent Application Publication No. 2003-115730). In the self-excited oscillation type PWM system, the triangular wave oscillation circuit is unnecessary, and a Schmitt trigger circuit, for example, is used instead of a comparator.

FIG. 7 is a block diagram depicting a conventional self-excited oscillation type class D amplifier. As FIG. 7 shows, the class D amplifier 101 with a differential output (Bridge-Tied Load: BTL) is comprised of a differential signal output unit 102 consisting of the resistors R101-R104 for converting voice signals from the input terminal Sin into differential signals, and the full differential amplifier A101, and each charge balanced class D amplifier at the P-side and N-side receiving the differential signals.

The N-side charge balanced class D amplifier comprises a PWM waveform generation circuit and a feedback circuit. The PWM waveform generation circuit consists of an integrating amplifier 103N consisting of an operation amplifier A102 and a capacitor C101, and a Schmitt trigger circuit 104N consisting of resistors R107-R109 and a comparator COMP 101. The feedback circuit comprises an output buffer B101 and a resistor R111 for negatively feeding back the output of the output buffer B101 to the integrating amplifier 103N. The PWM waveform generation circuit consisting of the integrating amplifier 103N and the Schmitt trigger circuit 104N, is a self-excited oscillation type oscillation circuit which oscillates automatically without providing triangular waves, and the output of the integrating amplifier 103N is a triangular wave.

The Schmitt trigger circuit 104N, at the power supply level is VDD1, has the following two threshold values according to the output LOW or HIGH for determining LOW and HIGH of the input voltage (output of integrating amplifier 103N).

$V_H$=Vcom ((R107+R109)/R109)

$V_L$=(Vcom (R107+R109)−VDD1 ×R107)/R109

The P-side charge balanced class D amplifier is also configured similar to the N-side, and in the Schmitt trigger circuit 104P, has the following two threshold values according to the output LOW or HIGH for determining LOW and HIGH of the input voltage (output of the integrating amplifier 103P).

$V_H$=Vcom ((R108+R110)/R110)

$V_L$=(Vcom (R108+R110)−VDD1 ×R108)/R110

Now the operation of a conventional class D amplifier will be described. FIG. 8 is a diagram depicting the signal waveform of each node in the class D amplifier 101, where S11 is a voice signal (analog signal) which comes from the input terminal Sin, S12 is an output waveform of the output buffer B102 when the voice signal is a silent signal, S13 is the P-side output waveform when the voice signal of S11 is presented from Sin, S14 is the N-side output waveform when the voice signal of S11 is provided from the input terminal Sin, and S15 is an amplitude applied to the load to be connected to the subsequent stage of the class D amplifier. FIG. 9 shows the relationship of the output voltage of the integrating amplifier (input voltage of the comparator) and the output voltage (Vout) of the output terminal OUTP where the abscissa is time and the ordinate is voltage.

First the case when voice signals are not provided from the input terminal Sin (voice signal=silent signal) will be described. The non-inverting input terminals of the integrating amplifiers 103N and 103P are connected to the reference potential Vcom respectively, and the non-inverting input terminals of the comparators COMP 101 and 102 are connected to the reference potential Vcom respectively. Each charge balanced class D amplifier at the P-side and the N-side operates similarly, so the operation of only the P-side charge balanced class D amplifier will be described below.

In the case when the voice signal is a silent signal, the voltage Vsin of the non-inverting input terminal of the integrating amplifier 103P is Vsin=Vcom. As FIG. 9A shows, if the output voltage Vout of the output terminal OUTP is HIGH (power supply level) (time T1), the output voltage $V_A$ of the integrating amplifier 103P drops since the current flows into the capacitor C102 of the integrating amplifier 103P through the resistor R112. If the output $V_A$ of the integrating amplifier 103P goes below the threshold level $V_L$ of the comparator COMP 102, the output voltage Vout of the output terminal OUTP goes LOW, and current flows out of the integrating amplifier 103P, so the output voltage $V_A$ of the integrating amplifier 103P increases. If the output voltage $V_A$ of the integrating amplifier 103P exceeds the threshold level $V_H$ of the comparator COMP 102, the comparator COMP 102 puts out HIGH, and the output terminal OUTP goes HIGH. Repeating the operations results in oscillation. At this time, the charge amount that flows into the integrating amplifier 103P from the output terminal OUTP via the feedback circuit and the charge amount which flows out from the integrating amplifier 103P to the OUTP side are equal, so the average output level is equal to the non-inverting input level (Vcom) of the integrating amplifier 103P (S2 in FIG. 8).

Now the case when the voice signal is input from the input terminal Sin will be described. According to the voice signal amplitude from the input terminal Sin shown in FIG. 7, the output level (Aop) of the differential amplifier A101 becomes as follows.

Aop=(Vsin−Vcom)×R104/(2×R101)

When the level of Aop is higher than the non-inverting level Vcom of the integrating amplifier A103, current flows into the integrating amplifier A103 from Aop. If the output terminal OUTP is HIGH at this time, the current that flows into the integrating amplifier 103P is the sum of the current from Aop and the current from the feedback circuit, thus as time T1 in FIG. 9B shows, the output voltage reaches the threshold level $V_L$ of the comparator COMP 102 and the output terminal OUTP goes LOW sooner compared with the case of a silent signal, that is time T1 in FIG. 9A. This means that the width of HIGH has become shorter. If the output terminal OUTP is LOW, on the other hand, the current that flows into the integrating amplifier 103P is the current from the feedback circuit from which the current from Aop is subtracted, therefore compared with the case of a silent signal, the time to reach the threshold level $L_H$ of the comparator COMP2 (time T2) becomes longer. This means that the time period of LOW becomes longer.

This is the same for the case when the level of Aop is at the lower level than Vcom, and as FIG. 9C shows, when the output terminal OUTP is HIGH, time T1 is longer since the current that flows into the integrating amplifier 103P is subtracted, and when the output terminal OUTP is LOW, the time T2 is shorter since the current that flows into the integrating amplifier A103 is added. In this way, PWM waveforms, where the duty of the output pulse changes according to the level of Aop, can be generated as shown in S13 and S14 in FIG. 8.

The output waveform which is acquired by filtering this output is as follows.

Vout=(Vsin−Vcom)×R104×R112/(2×R101 ×R106) +Vcom

In other words, the loop from the integrating amplifier 103P at the P-side to the-output buffer B102 has inversing amplifiers connected in a series. This is the same for the loop from the integrating amplifier 103N at the N-side to the output buffer B101.

In this conventional class D amplifier, when the analog signal shown in S11 in FIG. 8 has a level higher than the COM level, the pulse width of HIGH at the P-side output increases, and the pulse width of HIGH at the N-side output decreases. Therefore a plus charge is applied to the load so that output after filtering becomes the waveform according to the input (waveform indicated by the broken line in S15 in FIG. 8). However as S12 in FIG. 8 shows, both the P-side and N-side output the waveforms with a 50% duty at silent signal, and these waveforms are synchronized with the same phases, so although power to be applied to the load becomes 0 in theory, actually unnecessary power is consumed because the output buffer is in clock operation even at silent signal.

SUMMARY OF THE INVENTION

According to one aspect of the present invention, there is provided a class D amplifier which includes a first PWM waveform generation circuit for generating a PWM waveform according to one signal of differential signals, a second PWM waveform generation circuit for generating a PWM waveform according to the other signal of the differential signals, and a logic circuit for outputting AND of an output of the first PWM waveform generation circuit and an inverting output of the second PWM waveform generation circuit.

According to the present invention, the clock operation in a subsequent stage at silent signal can be stopped by outputting AND of the outputs and inverting the outputs of the two PWM waveforms acquired by the differential signals, and therefore power consumption can be decreased.

In other words, power consumption in the subsequent stage at silent signal can be 0 in theory by stopping the clock operation in the subsequent stage, by which power consumption can be decreased.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

Embodiments of the present invention will now be described with reference to the drawings. These embodiments are examples when the present invention is applied to a class D amplifier having a charge balanced type feedback loop.

Embodiment 1

Figure 1:
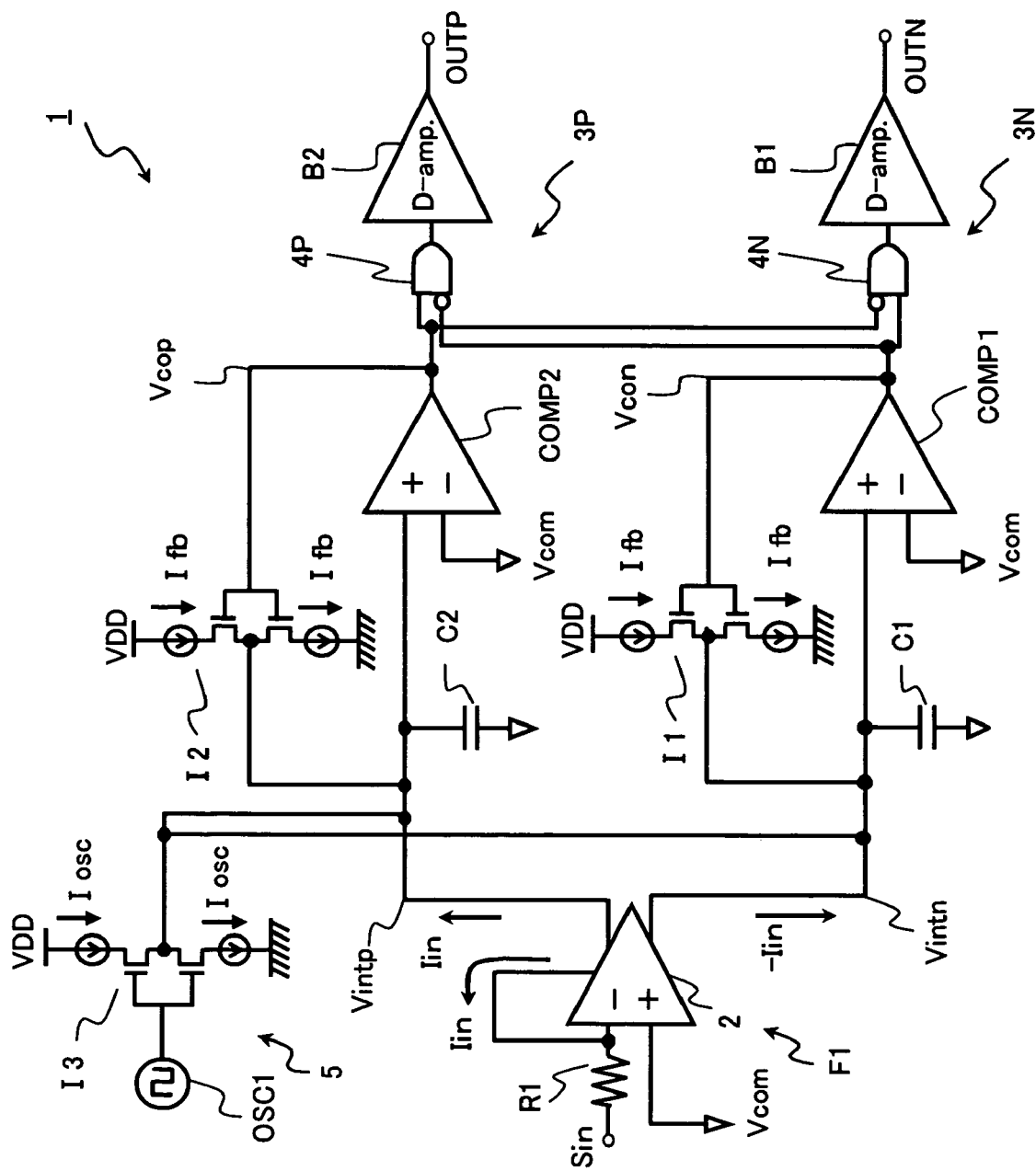
FIG. 1 is a block diagram depicting the class D amplifier according to an embodiment 1 of the present invention.

FIG. 1 is a block diagram depicting the class D amplifier according to the present embodiment. As FIG. 1 shows, the class D amplifier 1 comprises a voltage control current source circuit F1 as a differential signal output circuit for current-converting a voltage signal, such as voice, from the input terminal Sin, into differential signals, an oscillator circuit 5 for superimposing clocks onto the differential signals, and a N-side and an P-side charge balanced type class D amplifiers 3N and 3P to which the differential signals and clocks are input. The N-side charge balanced type class D amplifiers 3N comprises a PWM waveform generation circuit which is consisted of a capacitance element C1 and a comparator COMP1 for generating N-side PWM waveforms from one of the differential signals, and the P-side charge balanced type class D amplifiers 3P comprises a PWM waveform generation circuit which is consisted of a capacitance element C2 and a comparator COMP2 for generating P-side PWM waveforms from the other one of the differential signals. The N-side and an P-side charge balanced type class D amplifiers 3N and 3P further comprises logic gates (logic circuits) 4N and 4P for outputting AND of the output and inverting output of the comparators COMP1 and COMP2, an N-side output buffer (D amplifier) B1 and a P-side output buffer B2 for amplifying the output of the logic gates 4N and 4P respectively, and constant current source feedback circuits I1 and I2 for feeding back the output of the comparators COMP1 and COMP2 respectively.

In the present embodiment, AND of the PWM waveform is determined by the logic gates 4N and 4P which are created in a previous stage of the output buffers B1 and B2, and the result is input to the output buffers B1 and B2 so that the output at silent signal is fixed to LOW for both the P-side and N-side, and the clock operation is performed only when the signal, such as voice, is input.

Now the present embodiment will be described in detail. The voltage control current source circuit F1 comprises a full differential amplifier 2 wherein the non-inverting input terminal is connected to the reference potential Vcom, the voltage signal is input to the inverting input terminal from Sin via the resistance R1, and these voltage signals are converted into the differential signals, which are output to the N-side charge balanced type class D amplifier 3N and the P-side charge balanced type class D amplifier 3P in a subsequent stage.

The voltage control current source circuit F1 is a circuit for outputting current, which is the differential voltage between the input the voltage signal from Sin and the non-inverting input divided by the resistance R1, and is constructed such that the differential signals with different polarity are output to the N-side charge balanced type class D amplifier 3N and the P-side charge balanced type D amplifier 3P respectively. In other words, when the input the voltage signal is input from Sin, the current −Iin or Iin, according to this signal level, is output, and charges are added/subtracted for the capacitance elements C1 and C2, which are capacitors.

The current oscillator circuit 5 is comprised of a clock oscillation circuit OSC1, a switch for switching ON and OFF depending on the output level thereof, and a constant current source I3 for flowing HIGH or LOW level constant current by this switch, and outputs the current clock signals and superimposes them onto the differential signals. By this, the phases of the PWM signals generated in the N-side charge balanced type class D amplifier 3N and the P-side charge balanced type class D amplifier 3P can be accurately matched.

The constant current source feedback circuits I1 and I2 are voltage control current source circuits (logic control current source circuits) that can control the direction of the current flow by the difference of the voltage level (HIGH level or LOW level), and are connected to the outputs of the comparators COMP1 and COMP2 respectively to feedback the current to the capacitance elements C1 and C2. Each constant current source feedback circuit I1 or I2 comprises two constant current sources which are configured switching elements, such as transistors, and current mirror circuits, for example, which are connected between and the power supply potential VDD and the GND potential, and is constructed such that when the OUTP is at HIGH level, the constant current Ifb flows out of the constant current source feedback circuits I1 and I2, and when the OUTP is at LOW level, the constant current Ifb flows into the constant current source feedback circuits I1 and I2.

The capacitance elements C1 and C2 are for storing electric charges by the differential signals from the voltage control current source circuit F1, the clock signals from the current oscillator circuit 5, and the feedback current (Ifb) from the constant current source feedback circuits I1 and I2 respectively, and when current flows into the capacitance elements C1 and C2, the potentials of the capacitance elements C1 and C2 increases, and when current flows into the constant current source feedback circuits I1 and I2, the potentials of the capacitance elements C1 and C2 decrease. By the comparators COMP1 and COMP2 comparing these potential with the reference potentials Vcom, the PWM waveform are output respectively.

The logic gate 4N is a logic circuit for determining AND of the output of the comparator COMP1 and the inverting output of the comparator COMP2, and the logic gate 4P is a logic circuit for determining AND of the output of the comparator COMP2 and the inverting output of the comparator COMP1. By this, when the duty is 50%, signals are not input to the output buffers B1 and B2.

The output buffers B1 and B2 are class D output stages connected to the logic gates 4N and 4P, and comprise a power switching circuit for controlling the ON/OFF of the load current respectively. As mentioned above, at silent signal, output from the logic gates 4N and 4P become both LOW, therefore no signals are output from OUTN and OUTP.

As described above, in the class D amplifier 1 of the differential output, the logic gates 4N and 4P are disposed in a previous stage of the output buffers B1 and B2, and AND of the PWM waveform is input as a signal, so the clock operation of the output buffers B1 and B2 stops at silent signal, and power consumption at silent signal can be decreased to 0 in theory.

Figure 2:
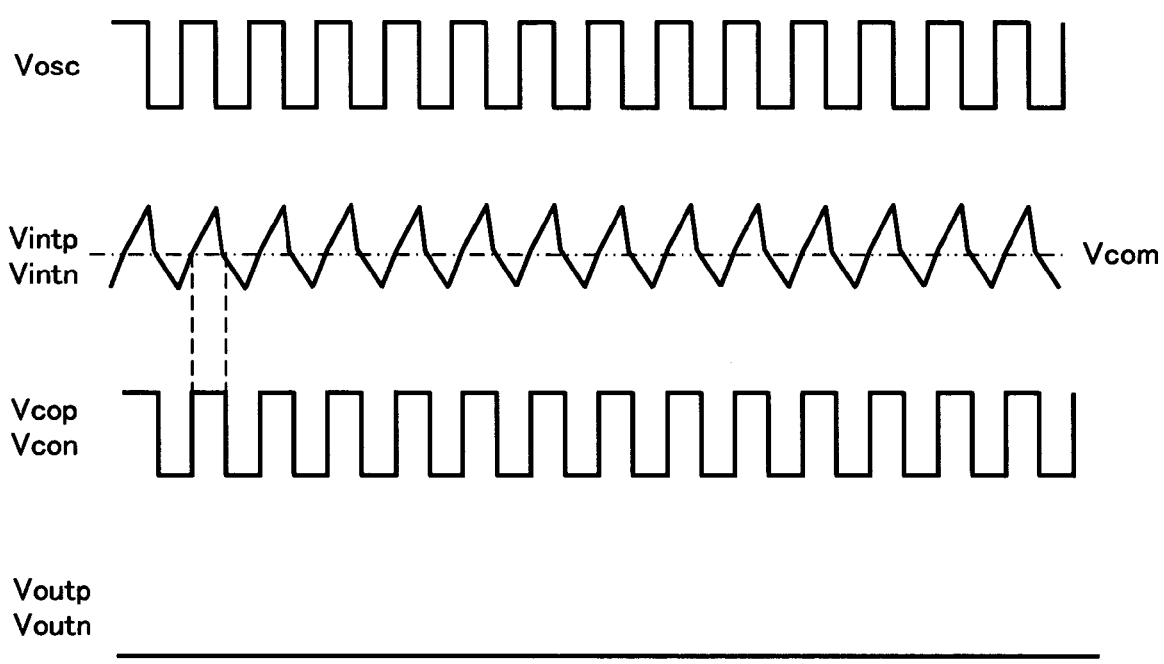
FIG. 2 shows signal waveforms in each output or node when the output Vosc and the input signal of the current oscillator circuit are silent signals.

Now the operation of the class D amplifier according to the present embodiment will be described. FIG. 2 shows signal waveforms in the output Vosc of the current oscillator circuit 5 and each output or node when the input signal of the voltage control current source circuit F1 is the silent signal. In other words, Vintp indicates the node potential between the output of the voltage control current source circuit F1 and the capacitance element C2 in the P-side charge balanced type class D amplifier 3P, Vintn indicates the node potential between the output of the voltage control current source circuit F1 and the capacitance element C1 in the N-side charge balanced type class D amplifier 3N, Vcop indicates the output potential of the comparators COMP2 in the P-side charge balanced type class D amplifier 3P, Vcon indicates the output potential of the comparators COMP1 in the N-side charge balanced type class D amplifier 3N, Voutp indicates the output of OUTP in the P-side charge balanced type class D amplifier 3P at this time, and Voutn indicates the output of OUTN in the N-side charge balanced type class D amplifier 3N at this time.

Figure 3:
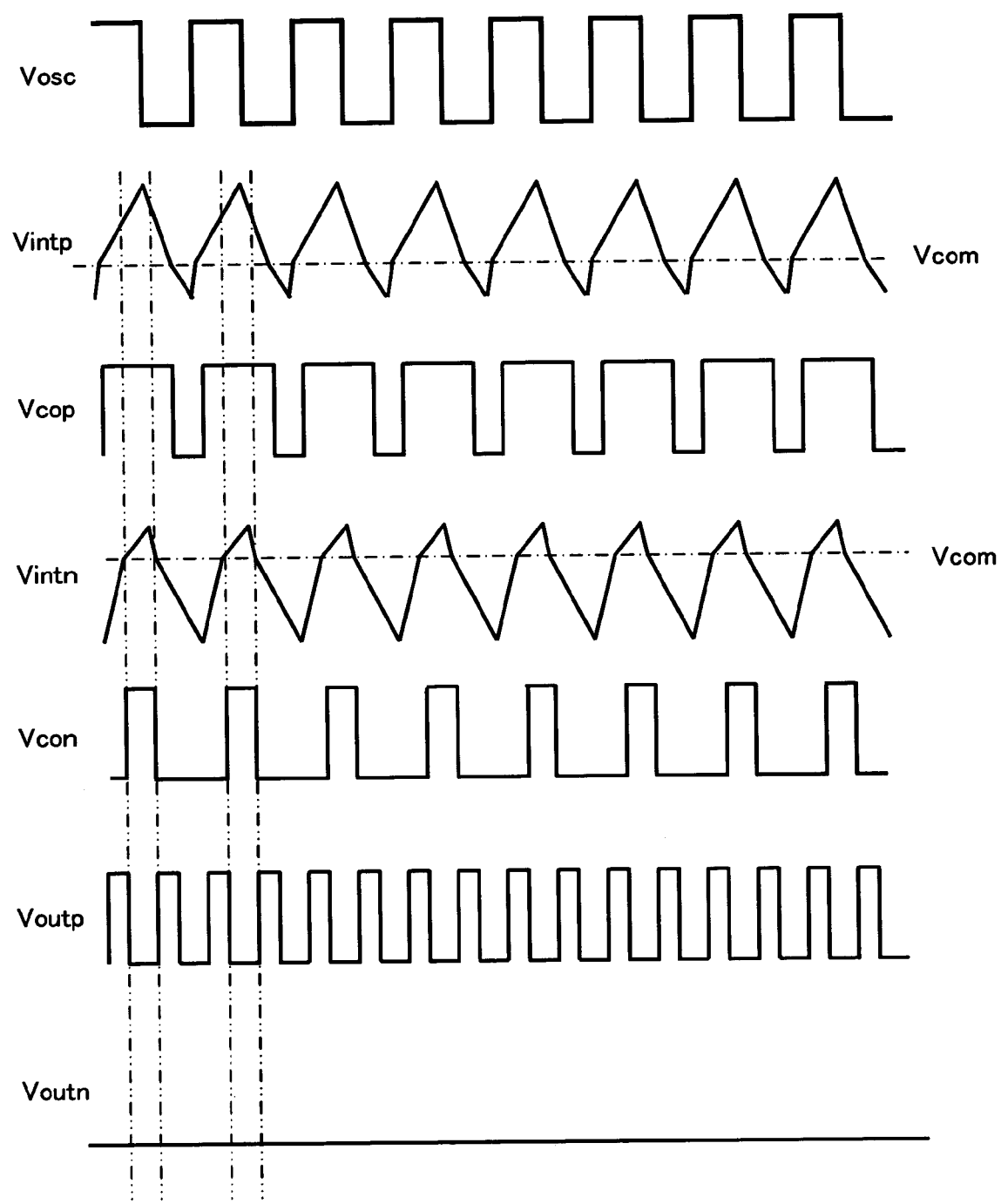
FIG. 3 shows signal waveforms in the case of input voltage signal Vsin>Vcom.
Figure 4:
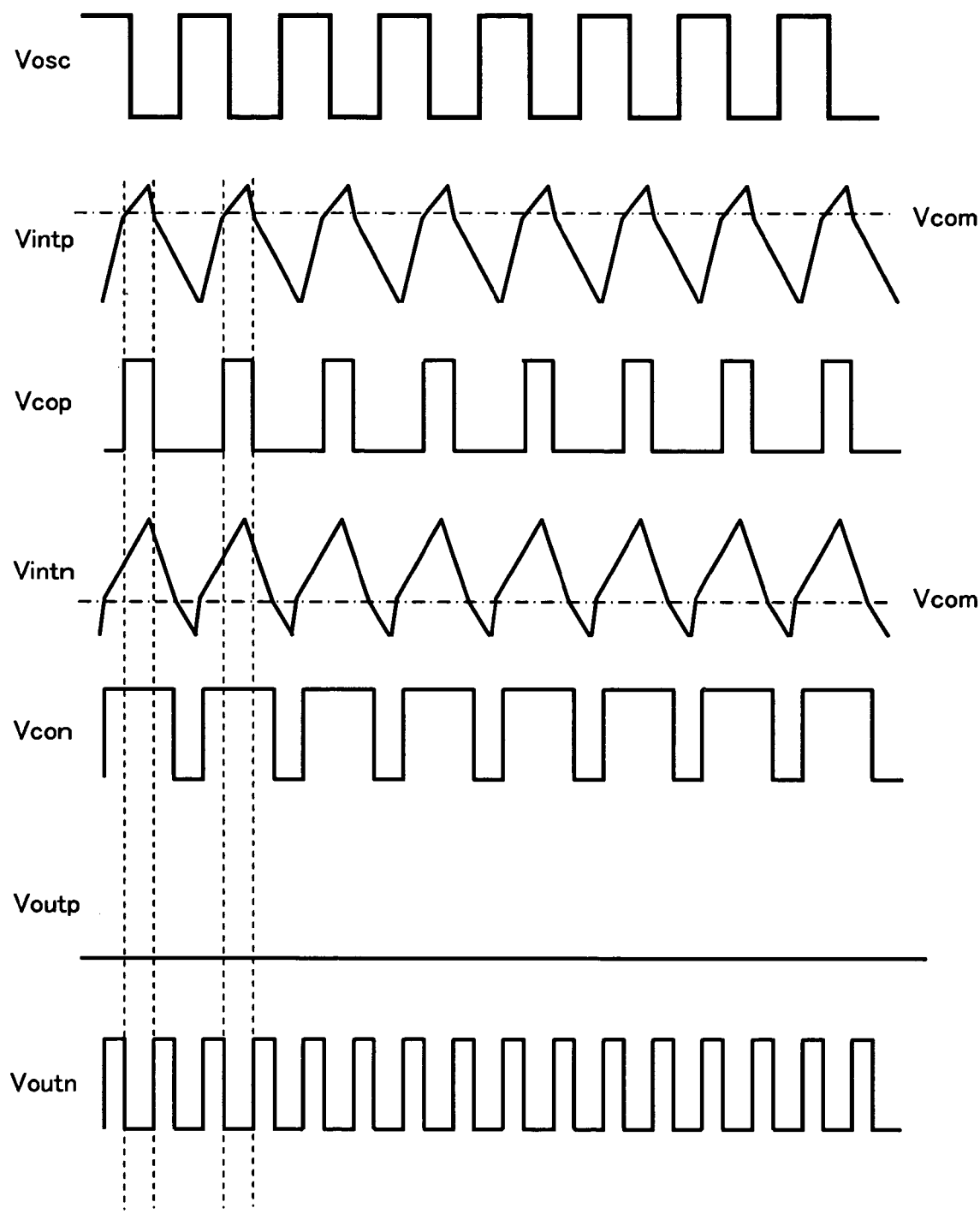
FIG. 4 shows signal waveforms in the case of input voltage signal Vsin<Vcom.
Figure 5:
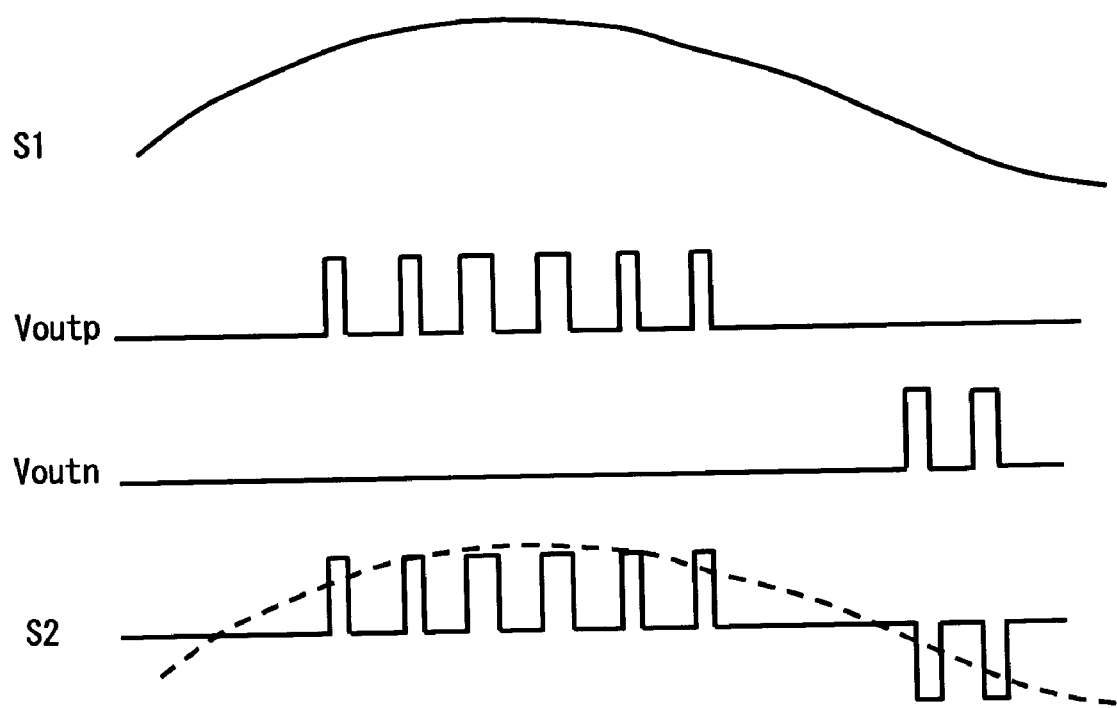
FIG. 5 is a diagram depicting an example of an analog signal which is input from Sin, where S1 indicates the analog signal, Voutp indicates the P-side output at this time, Voutn indicates the N-side output at this time, and S2 indicates the amplitude to be applied on the load.

FIG. 3 shows the signal waveforms in the case of input voltage signal Vsin>Vcom. FIG. 4 shows signal waveforms in the case of input voltage signal Vsin<Vcom. FIG. 5 is a diagram depicting an example of an analog signal which is input from Sin, where S1 indicates the analog signal, Voutp indicates the P-side output (the output of OUTP) at this time, Voutn indicates the N-side output (the output of OUTN) at this time, and S2 indicates the amplitude to be applied on the load.

As FIG. 2 shows, when the Vsin (the input potential from the input terminal Sin of the voltage control current source circuit F1) is equal to Vcom, the current input from the voltage control current source circuit F1 becomes 0, so Iin=0, and the current Ifb from the feedback circuit I2 and the current Iosc from the oscillator circuit 5 flow into Vintp. By the currents Ifb and Iosc being mixed, the shape of the triangular waves deform, as shown in Vintp. Comparing these triangular waves with the reference potential Vcom of the comparator COMP2, Vcop is square waves with a 50% duty. The CLK cycle of Vcop is the same as the clock signal Vosc from the oscillator circuit 5, but the phases are shifted. In the case when Sin is a silent signal, Vintp=Vintn and Vcop Vcon are established, and the output waveforms of the comparators COMP2 and COMP1 of the N-side charge balanced type class D amplifier 3N and the P-side charge balanced type class D amplifier 3P become the waveforms shown in FIG. 2 respectively. And in the N-side charge balanced type class D amplifier 3N, Voutp, which is AND of the output Vcop of the comparator COMP2 and the inverting output of the comparator COMP1 determined by the logic gate 4P, is output via the buffer B2, and Voutn, which is AND of the inverting output of the comparator COMP2 and the output Vcop of the comparator COMP1 determined by the logic gate 4N, is output via the buffer B1, and are both the differences of a same signal, so the output (Voutp, Voutn) becomes 0, and the clock operation of the load in a subsequent stage is not started.

Now the case of a signal input to Vsin will be described. In the case of Vsin>Vcom, as shown in FIG. 3, the current that flows into Vintp is Ifb+Iosc, to which the current Iin from the voltage control current source circuit F1 is added, when the output OUTP is at HIGH level. By this, the up and down inclinations of the triangular waves change, and are PWM-converted. In Vintp, an entire waveform becomes a higher voltage compared with the case of Vsin=Vcom in FIG. 2, since the current (Iin) from the voltage control current source circuit F1 is positive, and the time period of HIGH in the output Vcop of the comparator COMP2 increases.

In Vintn, on the other hand, an entire waveform becomes a lower voltage and the time period of HIGH in the output Vcon of the comparator COMP1 decreases, since the current from the voltage control current source circuit F1 is negative. If AND of this Vcop and the inverting signal of Vcon is determined, the P-side output Voutp is acquired, and if AND of the inverting signal Vcop and Vcom is determined, the N-side output Voutn is acquired.

In the case of Vsin<Vcom, the current from the voltage control current source circuit F1 to Vintp is negative, and the current to Vintn is positive, as shown in FIG. 4, so compared with the case of Vsin=Vcom shown in FIG. 2, an entire waveform becomes a lower voltage in Vintp, and the time period of HIGH in the output Vcop of the comparator COMP2 decreases. In Vintn, on the other hand, an entire waveform becomes a higher voltage, and the time period of HIGH in the output Vcon of the comparator COMP1 increases.

And as FIG. 3 shows, if Vsin>Vcom, AND of the inverting signal of Vcop and the output signal of Vcon become 0, and as FIG. 4 shows, if Vsin<Vcom, AND of the output of Vcop and the inverting output of Vcon becomes 0. Therefore if the analog signal S1 shown in FIG. 5 is input, for example, the P-side output Voutp and the N-side output Voutn become the outputs shown in FIG. 5 respectively. By this, the output after filtering becomes the waveform according to the input (waveform indicated by the broken line in FIG. 5).

In the present embodiment, the class D amplifier 1 comprises the voltage control current source circuit F1, to which analog signals are input, and from which differential signals are output, the two PWM waveform generation circuits, which are oscillation circuits consisting of a capacitance element, comparator and current feedback circuit, the oscillator circuit 5 for matching phases in the differential clock operation, and the logical circuit for determining AND of the output and the inverting output of the two PWM waveform generation circuit, and inputs the result into the output buffer, so the PWM waveform in the P-side charge balanced type class D amplifier and the PWM waveform in the N-side charge balanced type class D amplifier have the same phases, and the logic circuit determines the difference of these same phase PWM waveforms, so the clock operation of the output buffer can be stopped at silence signal (Vsin=Vcom), and power consumption of the output buffer can be 0 in theory.

In some cases the noise which is normally generated when the power supply switch is turned ON or OFF is amplified by the power amplifier, and is output from the speaker as an impulsive noise, the so called "POP noise", and in order to minimize the generation of this POP noise, a mute circuit is installed in the input terminal of the power amplifier, and the path of the input signal is grounded until the power amplifier is stabilized, or a soft-start circuit is installed and signals are filtered by soft processing when output is started and ended, but according to the present invention, such a POP noise removal circuit is unnecessary since the output reference level after startup is GND level.

Embodiment 2

Figure 6:
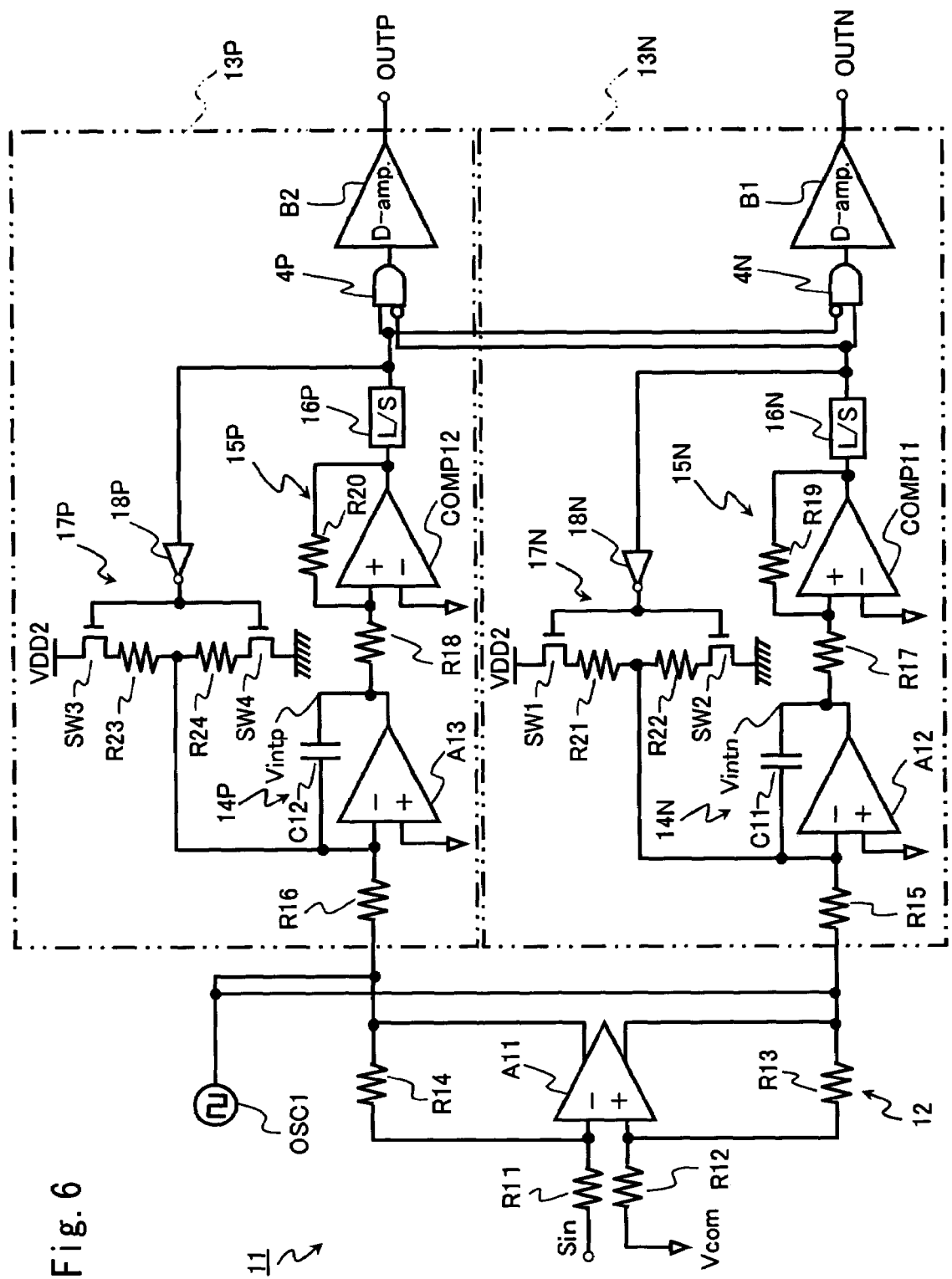
FIG. 6 is a block diagram depicting the class D amplifier according to an embodiment 2 of the present invention.

As described in Embodiment 1, in order to stop the clock operation at silent signal for decreasing power consumption, all that is needed is that PWM waveforms, of which phases are matched, can be generated and AND of the output and the inverting output of the two PWM waveforms can be determined in a previous stage of the output buffer. Therefore the configuration in a previous stage of the logic gates 4N and 4P is not limited to the configuration in FIG. 1. FIG. 6 is a block diagram depicting the class D amplifier according to Embodiment 2. In Embodiment 2 shown in FIG. 6, composing elements the same as Embodiment 1 shown in FIG. 1 are denoted with the same reference symbols, for which detailed description is omitted.

FIG. 6 is a block diagram depicting the class D amplifier according to Embodiment 2 of the present invention, As FIG. 6 shows, the class D amplifier 11 of the present invention is comprised of a differential signal output unit 12 comprising resistors R11-R14 and a full differential amplifier A11, a P-side and an N-side charge balanced type class D amplifiers 13N and 13P to which the differential signals are input, and an oscillator circuit OSC1 for superimposing the clock signals onto the differential signals. The differential signal output unit 12 converts the voice signals, which are input from the input terminal Sin, into the differential signals.

The N-side charge balanced type class D amplifier 13N comprises a PWM waveform generation circuit which is comprised of an integrating amplifier 14N consisting of an operational amplifier A12 and a capacitor C11, and a Schmitt trigger circuit 15N consisting of resistors R17 and R19 and a comparator COMP11, a level shift (L/S) circuit 16N for shifting the level of the output of the Schmitt trigger circuit 15N, a logic gate 4N for determining AND of the output of the level shift circuit 16N and inverting output of the level shift circuit 16P of the later mentioned P-side charge balanced type class D amplifier 13P, an output buffer B1 for amplifying the output of the logic gate 4N and a charge balanced type feedback loop (feedback circuit) 17N for negatively feeding back the output of the level shift circuit 16N to the integrating amplifier 14N. In the present embodiment, it is assumed that the power supply level of the PWM waveform generation circuit is VDD1, and the power supply level after level shift is VDD2.

The P-side charge balanced type class D amplifier 13P is also constructed in the same way as the N-side charge balanced type class D amplifier 13N, that is, it comprises a PWM waveform generation circuit which is comprised of an integrating amplifier 14P consisting of an operation amplifier A13 and a capacitor C12, and a Schmitt trigger circuit 15P consisting of resistors R18 and R20 and a comparator COMP12, a level shift (L/S) circuit 16P for shifting the level of the output of the Schmitt trigger circuit 15P, a logic gate 4P for determining AND of the output of the level shift circuit 16N and the inverting output of the level shift circuit 16N of the above mentioned N-side charge balanced type class D amplifier 13N, an output buffer B2 for amplifying the output of the logic gate 4P, and a feedback circuit 17P for negatively feeding back the output of the level shift circuit 16P to the integrating amplifier 14P.

In the differential signal output unit 12, the non-inverting input terminal of the full differential amplifier A11 is connected to the fixed potential Vcom, the input signal is input to the inverting input terminal Sin, the differential signals are output according to the input signal, and one of the differential signals is input to the N-side charge balanced type class D amplifier 13N and the other is input to the P-side charge balanced type class D amplifier 13P. The negative differential signal is output to the P-side charge balanced type class D amplifier 13P, if the input signal, which is input from Sin, is Vsin>Vcom, and the positive differential signal is output if Vsin<Vcom.

In the case of the N-side charge balanced type class D amplifier 13N, in the integrating amplifier 14N, one of the differential signals, the clock signals from the oscillator circuit OSC1, and the feedback signals from the feedback circuit 17N, are input to the inverting input terminal of the operational amplifier A12, by which electric charges are stored in the capacitor C11, and the output thereof becomes triangular waves, as shown in FIG. 2 (in the case of a silent signal) or as in FIG. 3 and FIG. 4 (in the case of a signal input).

In the Schmitt trigger circuit 15N, the output of the integrating amplifier 14N is input to the non-inverting input terminal via the resistor R17, and the inverting input terminal is connected to the fixed potential Vcom. In this Schmitt trigger circuit 15N, the voltage for determining LOW or HIGH of the input voltage (output of the integrating amplifier 14N) has the following two threshold values depending on whether the output is LOW or HIGH.

$$V_H = V\text{com} \, ((R17+R19)/R19)$$

$$V_L = (V\text{com} \, (R17+R19) - \text{VDD} \times R17)/R19$$

The P-side charge balanced type class D amplifier is also constructed in the same way as the N-side, and the Schmitt trigger circuit 15P has the following two threshold values.

$$V_H = V\text{com} \, ((R18+R20)/R20)$$

$$V_L = (V\text{com} \, (R18+R20) - \text{VDD} \times R18)/R20$$

The PWM waveform generation circuit, which is comprised of the integrating amplifier 14N and the Schmitt trigger circuit 15N, is a self-excited oscillation type oscillation circuit which automatically oscillates without inputting triangular waves, and makes the output of the integrating amplifier 14N to be triangular waves.

The level shift circuit 16N is for converting the output of the Schmitt trigger circuit 15N into the power supply level of the output buffer B1. If the class D amplifier is installed in equipment which is used for such applications as a portable telephone of which power consumption is limited, the smaller the power consumption the better, so low power consumption is implemented by constructing the PWM waveform generation circuit in a previous stage of the output buffer B1 such that the power supply level is decreased. For this, it is necessary to level-shift the output of the PWM waveform generation circuit by the level shift circuit 16N, and the power supply level is increased in the output stage so as to acquire high amplitude. In this case, the power supply level VDD1 of the integrating amplifiers 14N and 14P, the operational amplifiers A12 and A13 constituting the Schmitt trigger circuits 15N and 15P, and the comparators COMP11 and COMP12 is 3V, for example, and the power supply level VDD2 of the output buffers B1 and B2 is 15V, for example.

If resistance feedback is performed on level-shifted signals here, the average output level at silent signal is determined by the non-inverting input level of the integrating amplifier, so the GND side clamps and sufficient amplitude cannot be taken. To take sufficient amplitude, the average output level at silent signal must be changed according to the power supply level VDD2 of the output buffers B1 and B2. In other words, the average output level at silent signal must be VDD2/2. Therefore in the present embodiment, these feedback circuit 17N and 17P are constructed such that the feedback amount is variable according to the output level of the output buffers B1 and B2, so that the output is oscillated with VDD2/2 at the center, by which amplitude can fully reach the power supply level.

In other words, in the N-side charge balanced type class D amplifier 13N, the feedback circuit 17N can set the current feedback amount by adjusting R21 according to VDD2, so that the current feedback amount does not become high by VDD2. For this, the feedback circuit 17N comprises an inverter 18N for inverting the output of the level shift circuit 16N, a switch SW1, which is an MOS (Metal Oxide Semiconductor) transistor, for example, which turns ON/OFF by the inverter output, a resistor R21 which is connected to the power supply VDD2 via the switch SW1, a switch SW2 which turns ON/OFF by the inverter output, and a resistor R22 of which one end is connected to the GND via the switch SW2 and the other end is connected to the resistor R21, and is constructed such that the electric charges of the node between the resistor R21 and the resistor R22 flow into the integrating amplifier 14N.

In this feedback circuit 17N, the switch SW1 turns ON and the resistor R21 is connected to the power supply potential VDD2 when the output of the level shift circuit 16N is high level, and the switch SW2 turns ON and the resistor R22 is connected to the GND when the output of the level shift circuit 16N is low level. The feedback circuit 17P at the P-side charge balanced type class D amplifier 13P is constructed the same, wherein the switch SW3 turns ON and the resistor R23 is connected to the power supply potential VDD2 when the output of the level shift circuit 16P is high level, and the switch SW4 turns ON and the resistor R24 is connected to the GND when the output of the level shift circuit 16P is low level.

In the feedback circuit 17N, the power supply potential VDD2, the fixed potential Vcom and the resistance values of the resistors R21 and R22 (expressed as R21 and R22) have the relationship shown in the following Expression (1).

$$(VDD2-Vcom)/R21=(Vcom-(GND))/R22 \quad (1)$$

Also in the feedback circuit 17P, the power supply potential VDD2, the fixed potential Vcom and the resistance values of the resistors R23 and R24 (expressed as R23 and R24) have the relationship shown in the following Expression (2).

$$(VDD2-Vcom)/R23=(Vcom-(GND))/R24 \quad (2)$$

In other words, the feedback circuits 17N and 17P can switch the feedback amount by selecting different resistance values R21 and R23 or R22 and R24 depending on the HIGH level or LOW level in the level shift circuits 16N and 16P, so as to feedback the same level of the current regardless the output level, and to enable the level shift of the PWM signal output.

In this case, the resistors R21-R24 are set as follows. In the status where the clock signals are not superimposed, the input from the differential signal output unit 12 is 0 when the Vsin input is equal to Vcom, therefore the currents which flow into Vintn and Vintp are $$(VDD2-Vcom)/R21$$

$$(VDD2-Vcom)/R23$$

respectively. The currents which flow out of Vintn and Vintp, on the other hand, are $$(Vcom-(GND))/R22$$

$$(Vcom-(GND))/R24$$

respectively.

Since these currents that flow in and currents that flow out are equal, as the above Expressions (1) and (2) show (hereafter this current amount is expressed as Ifb), Vintn and Vintp present triangular waves of which the up and down inclinations are the same. In the present embodiment, the waveforms, that is the triangular waves to which clock signals are superimposed, are input to the Schmitt trigger circuits 15N and 15P, and become square waves by the above mentioned two threshold values. If Vsin is a silent signal, Vintp=Vintn and OUTP=OUTN are established, and the output waveforms of the N-side charge balanced type class D amplifier 13N and the P-side charge balanced type class D amplifier 13P both become square waves with the same phase.

And when a signal is input to Vsin, a PWM waveform is generated for the time period of HIGH or LOW according to the input level thereof. In the present embodiment, the Schmitt trigger circuits 15N and 15P of the comparator with hysteresis are used, but the Schmitt trigger circuits of a comparator without hysteresis may be used instead of the Schmitt trigger circuits 15N and 15P, since oscillation is stabilized by the clock signals.

The present embodiment presents effects the same as the above Embodiment 1. In other words, the clock operation in the output buffers B1 and B2 is stopped at a silent signal by inputting AND of the outputs and the inverting outputs of the level shift circuits 16N and 16P, which are the outputs of a previous stage of the output buffers B1 and B2, so power consumption can be decreased compared with prior art.

Also in the present embodiment, the outputs of the Schmitt trigger circuits 15N and 15P are converted into the power supply level of the output stage (output buffers B1 and B2) by the level shift circuits 16N and 16P, and are output from OUTN and OUTP, but the feedback charge amount at the power supply side and the GND side can be changed respectively, and the average output level at silent signal can be equivalently changed by inserting the inverters 18N and 18P in the feedback paths from the level shift circuits 16N and 16P respectively, alternately turning the switches ON and OFF at the power supply side and at the GND by the output of the inverters 18N and 18P, selecting the resistor R21 or R22, or the resistor R23 or R24, and feeding back the current according to the selected resistance to the integrating amplifiers 14N and 14P, and as a result power consumption can be further decreased.

Figure 7:
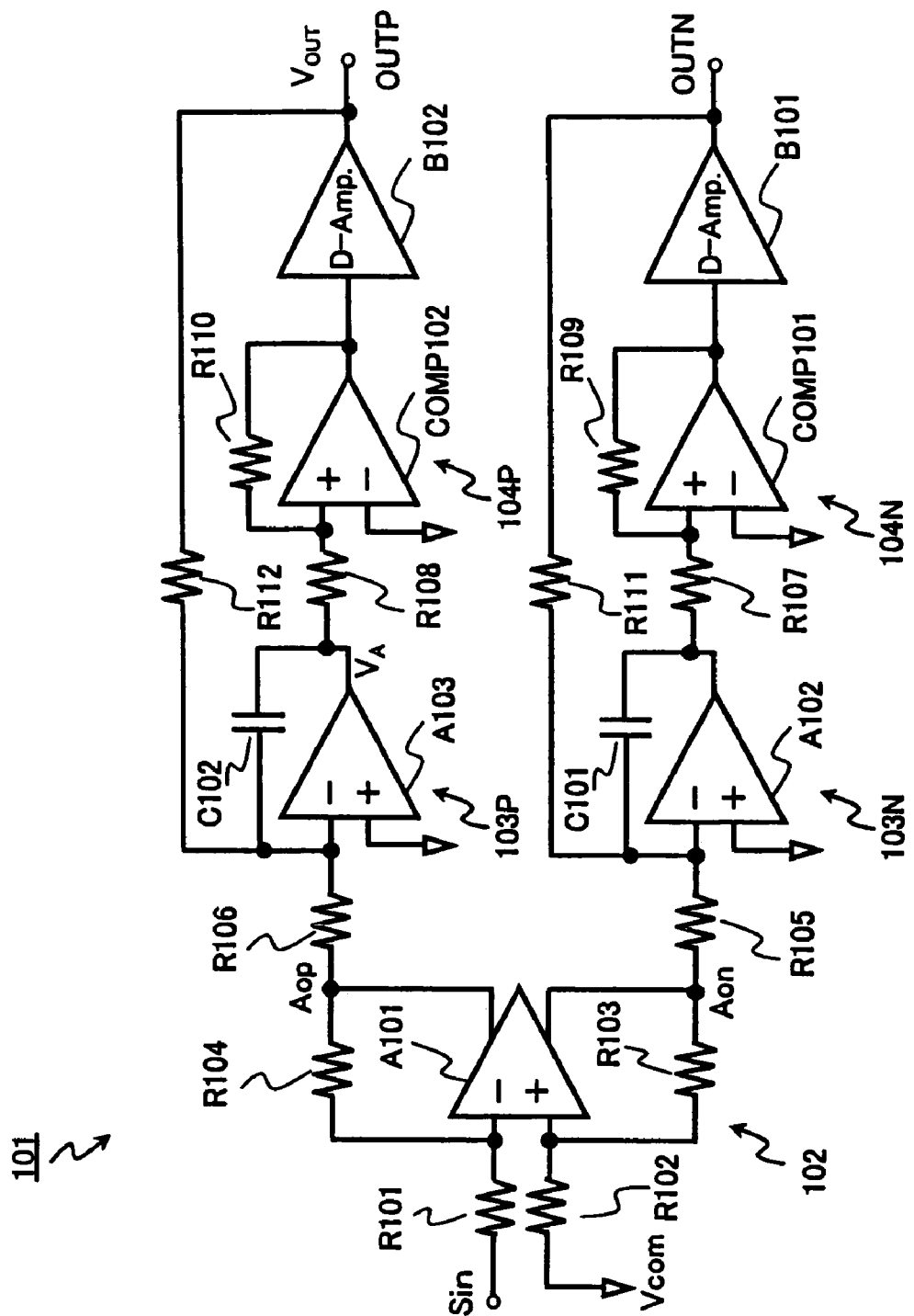
FIG. 7 is a block diagram depicting a conventional self-excited oscillation type class D amplifier.
Figure 8:
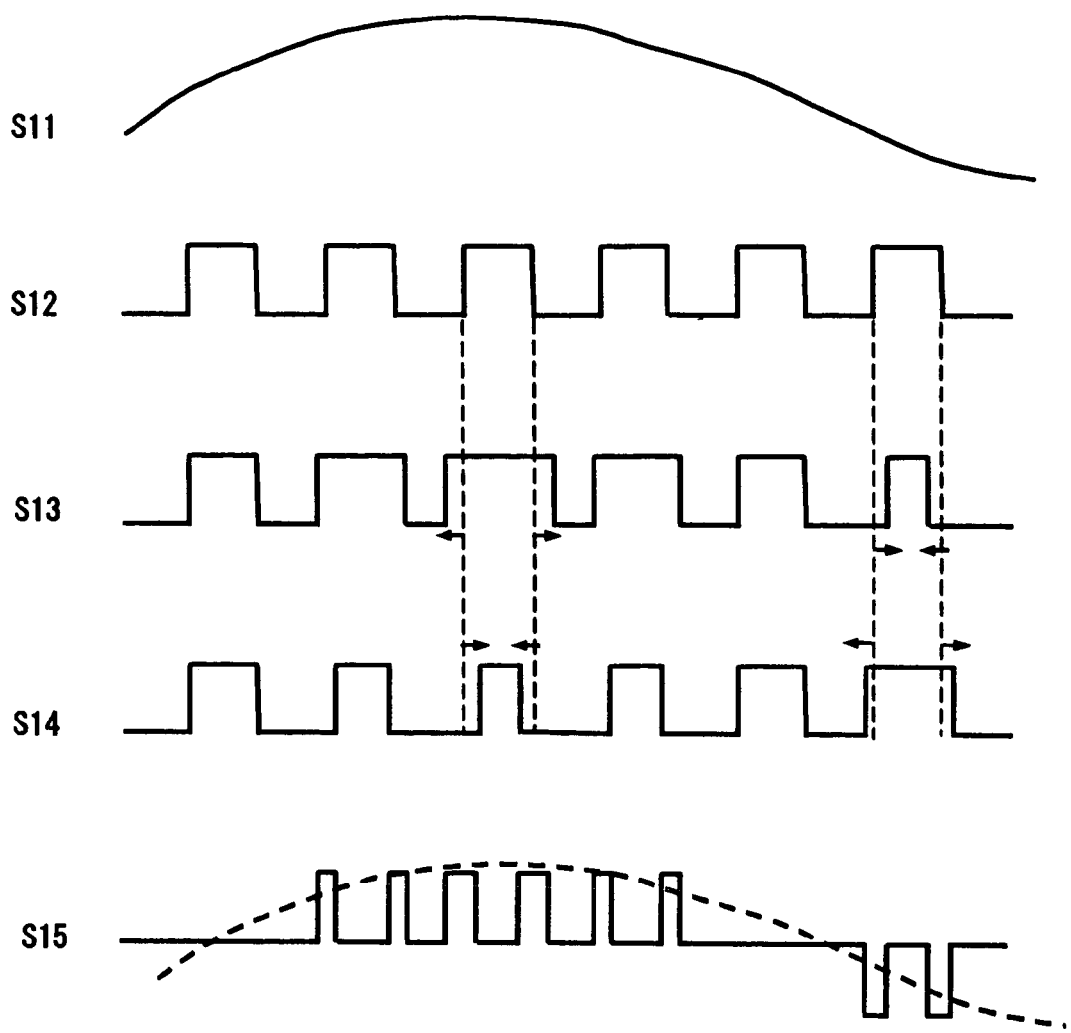
FIG. 8 is a diagram depicting the signal waveform at each node of the class D amplifier.
Figure 9A:
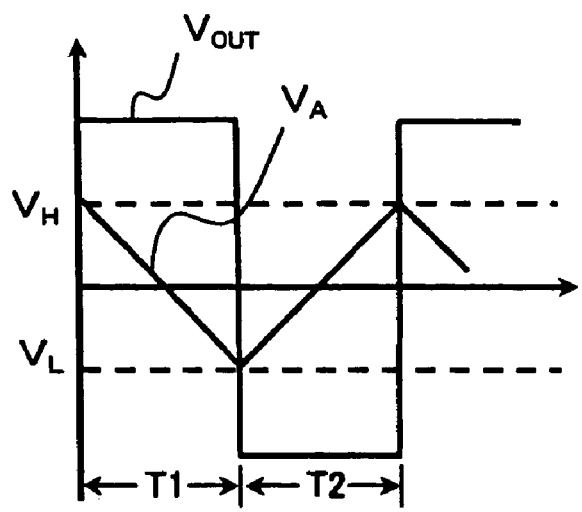
FIG. 9A-FIG. 9C show the relationship between the output voltage (input voltage of comparator) of the integrating amplifier and the output voltage of OUTP where the abscissa is time and the ordinate is voltage.
Figure 9B:
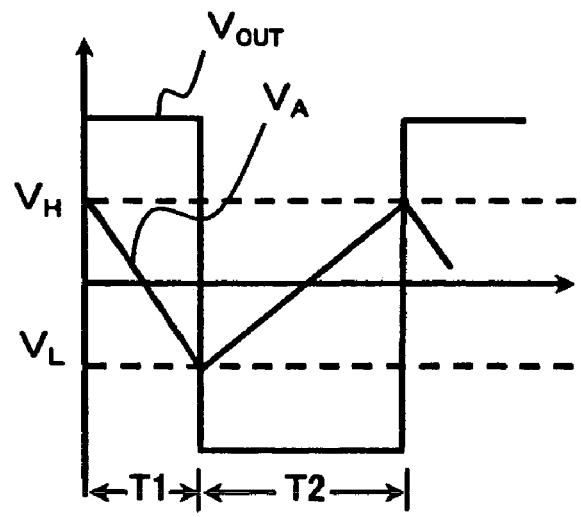
Figure 9C:
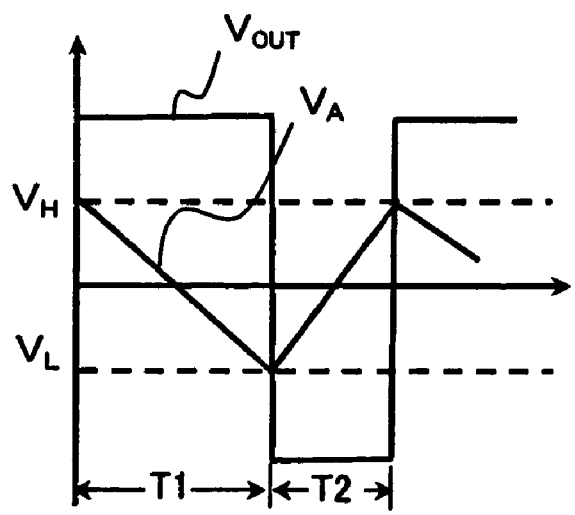

It is apparent that the present invention is not limited to the above embodiment, that may be modified and changed without departing from the scope and spirit of the invention. For example, in Embodiment 1, power consumption can be decreased by removing the integrating amplifier, by stopping the clock operation of the output buffers at a silent signal and using the current-converted differential signals so as to feedback the feedback signals from the feedback circuit as current. Whereas in the conventional class D amplifier shown in FIG. 7, the present embodiment can be constructed such that clock signals are superimposed onto the differential signals, a logic gate is created and only AND of the two PWM waveform outputs and the inverting outputs are input to the output buffer in the self-excited type class D amplifier of which the PWM waveform circuit is comprised of an integrating amplifier and a Schmitt trigger circuit, then the clock operation in the output buffer can be stopped at a silent signal, and power consumption can be decreased.

In Embodiment 2, it was described that the feedback circuits 17N and 17P are supposed to be comprised of resistors with predetermined resistance values, but the feedback circuits 17N and 17P may be comprised of variable resistors. In this case, a plurality of resistors with different resistance values are connected in parallel, for example, and the resistors are connected by switching using an external signal so that the resistance values are switched by the external signal, and the desired resistance value is implemented.

In this case, as the following Expression (3) shows, the ratio of the average resistance values of the feedback circuits 17N and 17P and the resistance 15 or the resistance 16 becomes the gain G of this system. In other words, the gain of the system can be variable by constructing the feedback circuits 17N and 17P such that the resistance values can be set as variable.

$$\text{Gain } G=2\times R15/(R21+R22) \quad (3)$$

What is claimed is:

1. A class D amplifier comprising:
   a first PWM waveform generation circuit for generating a PWM waveform according to one signal of differential signals;
   a second PWM waveform generation circuit for generating a PWM waveform according to the other signal of the differential signals;

a logic circuit for outputting AND of an output of the first PWM waveform generation circuit and an inverting output of the second PWM waveform generation circuit;

a feedback circuit for feeding back an output of the first PWM waveform generation circuit to the first PWM waveform generation circuit; and a voltage-current conversion circuit for converting an input signal into current and outputting the differential signals, wherein the first and second PWM waveform generation circuits comprise respectively a capacitance element for storing electric charges by the differential signals, the clock signals and feedback signals, a comparison circuit for comparing a potential of the capacitance element and a reference potential and outputting the PWM waveform, and a feedback circuit for converting an output of the comparison circuit into current and feeding it back to the capacitance element.

2. The class D amplifier according to claim 1, further comprising an oscillator circuit for superimposing clock signals onto the differential signals.

3. The class D amplifier according to claim 1, wherein the logic circuit comprises a first logic circuit for outputting AND of the output of the first PWM waveform generation circuit and the inverting output of the second PWM waveform generation circuit, and a second logic circuit for outputting AND of an inverting output of the first PWM waveform generation circuit and an output of the second PWM waveform generation circuit.

4. The class D amplifier according to claim 3, further comprising a first output buffer for amplifying an output of the first logic circuit and a second output buffer for amplifying an output of the second logic circuit.

5. The class D amplifier according to claim 1, wherein the first and second PWM waveform generation circuits comprise a comparison circuit for comparing an input signal and a triangular wave and outputting the PWM waveform.

6. The class D amplifier according to claim 1, further comprising a level shift circuit for shifting a level of the outputs of the first and second PWM waveform generation circuit, and a feedback circuit for feeding back an output of the level shift circuit to the PWM waveform generation circuit, wherein the feedback circuit converts the feedback amount according to an output level from the level shift circuit into an feedback amount according to the PWM waveform generation circuit and outputting it as a feedback signal.

7. The class D amplifier according to claim 3, further comprising a feedback circuit for feeding back an output of the second PWM waveform generation circuit to the second PWM waveform generation circuit.

8. A class D amplifier comprising:
a first PWM waveform generation circuit for generating a PWM waveform according to one signal of differential signals;
a second PWM waveform generation circuit for generating a PWM waveform according to the other signal of the differential signals;
a logic circuit for outputting AND of an output of the first PWM waveform generation circuit and an inverting output of the second PWM waveform generation circuit; and
a level shift circuit for shifting a level of the outputs of the first and second PWM waveform generation circuit, and a feedback circuit for feeding back an output of the level shift circuit to the PWM waveform generation circuit, wherein the feedback circuit converts the feedback amount according to an output level from the level shift circuit into an feedback amount according to the PWM waveform generation circuit and outputting it as a feedback signal.

9. The class D amplifier of claim 8, further comprising:
a feedback circuit for feeding back an output of the first PWM waveform generation circuit to the first PWM waveform generation circuit.

10. The class D amplifier according to claim 8, further comprising an oscillator circuit for superimposing clock signals onto the differential signals.

11. The class D amplifier according to claim 8, wherein the logic circuit comprises a first logic circuit for outputting AND of the output of the first PWM waveform generation circuit and the inverting output of the second PWM waveform generation circuit, and a second logic circuit for outputting AND of an inverting output of the first PWM waveform generation circuit and an output of the second PWM waveform generation circuit.

12. The class D amplifier according to claim 11, further comprising a first output buffer for amplifying an output of the first logic circuit and a second output buffer for amplifying an output of the second logic circuit.

13. The class D amplifier according to claim 8, wherein the first and second PWM waveform generation circuits comprise a comparison circuit for comparing an input signal and a triangular wave and outputting the PWM waveform.

14. The class D amplifier according to claim 8, further comprising a voltage-current conversion circuit for converting an input signal into current and outputting the differential signals, wherein the first and second PWM waveform generation circuits comprise respectively a capacitance element for storing electric charges by the differential signals, the clock signals and feedback signals, a comparison circuit for comparing a potential of the capacitance element and a reference potential and outputting the PWM waveform, and a feedback circuit for converting an output of the comparison circuit into current and feeding it back to the capacitance element.

15. The class D amplifier according to claim 8, further comprising:
a first feedback circuit for feeding back an output of the first PWM waveform generation circuit to the first PWM waveform generation circuit; and
a second feedback circuit for feeding back an output of the second PWM waveform generation circuit to the second PWM waveform generation circuit.

16. A class D amplifier comprising:
a first PWM waveform generation circuit for generating a PWM waveform according to one signal of differential signals;
a second PWM waveform generation circuit for generating a PWM waveform according to the other signal of the differential signals;
a logic circuit for outputting AND of an output of the first PWM waveform generation circuit and an inverting output of the second PWM waveform generation circuit;
a first output buffer for amplifying an output of the first logic circuit; and
a second output buffer for amplifying an output of the second logic circuit,
wherein the logic circuit comprises a first logic circuit for outputting AND of the output of the first PWM waveform generation circuit and the inverting output of the second PWM waveform generation circuit, and a second logic circuit for outputting AND of an inverting output of the first PWM waveform generation circuit and art output of the second PWM waveform generation circuit.

17. The class D amplifier according to claim 16, wherein the first and second PWM waveform generation circuits comprise a comparison circuit for comparing an input signal and a triangular wave and outputting the PWM waveform.

18. The class D amplifier according to claim 16, further comprising a voltage-current conversion circuit for converting an input signal into current and outputting the differential signals, wherein
the first and second PWM waveform generation circuits comprise respectively a capacitance element for storing electric charges by the differential signals, the clock signals and feedback signals, a comparison circuit for comparing a potential of the capacitance element and a reference potential and outputting the PWM waveform, and a feedback circuit for converting an output of the comparison circuit into current and feeding it back to the capacitance element.

19. The class D amplifier according to claim 16, further comprising a level shift circuit for shifting a level of the outputs of the first and second PWM waveform generation circuit, and a feedback circuit for feeding back an output of the level shift circuit to the PWM waveform generation circuit wherein the feedback circuit converts the feedback amount according to an output level from the level shift circuit into an feedback amount according to the PWM waveform generation circuit and outputting it as a feedback signal.

20. The class D amplifier according to claim 16, further comprising:
an oscillator circuit for superimposing a clock signal onto the differrential signals.

21. The class D amplifier according to claim 16, further comprising:
a first feedback circuit for feeding back an output of the first PWM waveform generation circuit to the first PWM waveform generation circuit; and
a second feedback circuit for feeding back an output of the second PWM waveform generation circuit to the second PWM waveform generation circuit.

* * * * *